United States Patent
Zannoth et al.

(10) Patent No.: US 10,215,795 B1
(45) Date of Patent: Feb. 26, 2019

(54) THREE LEVEL GATE MONITORING

(71) Applicant: Infineon Technologies AG, Neubiberg (DE)

(72) Inventors: Markus Zannoth, Neubiberg (DE); Jaafar Mejri, Ottobrunn (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/953,146

(22) Filed: Apr. 13, 2018

(51) Int. Cl.
| | |
|---|---|
| *H03K 5/153* | (2006.01) |
| *G01R 31/26* | (2014.01) |
| *H02M 1/08* | (2006.01) |
| *G01R 19/165* | (2006.01) |
| *H03K 17/0812* | (2006.01) |
| *H03K 17/08* | (2006.01) |

(52) U.S. Cl.
CPC ... *G01R 31/2621* (2013.01); *G01R 19/16519* (2013.01); *H02M 1/08* (2013.01); *H03K 17/08122* (2013.01); *H03K 2017/0806* (2013.01)

(58) Field of Classification Search
CPC ........ H03K 5/2481; H03K 5/249; H03K 5/08; H03K 5/24; G01R 19/16519
USPC .................................................. 327/77, 108
See application file for complete search history.

(56) References Cited

U.S. PATENT DOCUMENTS

| | | | |
|---|---|---|---|
| 5,903,130 A | 5/1999 | Rice et al. | |
| 6,172,541 B1 | 1/2001 | Young et al. | |
| 6,307,409 B1 | 10/2001 | Wrathall et al. | |
| 6,720,819 B1 | 4/2004 | Yamamoto et al. | |
| 6,809,560 B1 | 10/2004 | Wrathall et al. | |
| 9,391,604 B2 | 7/2016 | Barrenscheen et al. | |
| 2007/0222739 A1* | 9/2007 | Yu | ........................ G09G 3/3406 345/102 |
| 2009/0039273 A1* | 2/2009 | Tkaczyk | ................. G01T 1/171 250/370.06 |

(Continued)

FOREIGN PATENT DOCUMENTS

| | | |
|---|---|---|
| EP | 1770862 A1 | 4/2007 |
| EP | 3229373 A1 | 10/2017 |

(Continued)

OTHER PUBLICATIONS

Infineon Technologies AG, "EiceDRIVER SIL High Voltage IGBT Driver for Automotive Applications 1EDI2002AS Single Channel Isolated Driver for Inverter Systems AD Step," Final Datasheet, Harware Description, Rev. 3.1, Edition Jul. 30, 2015, Munich Germany, 147 pages.

*Primary Examiner* — Anh Q Tra

(74) *Attorney, Agent, or Firm* — Slater Matsil, LLP

(57) ABSTRACT

A method of monitoring a gate of a transistor includes monitoring a gate voltage of the transistor; measuring a first time difference between when a gate control signal is asserted and when the gate voltage of the transistor crosses a first voltage threshold based on the monitoring; measuring a second time difference between when the gate voltage of the transistor crosses the first voltage threshold and when the gate voltage of the transistor crosses a second voltage threshold based on the monitoring; and determining whether the first time difference falls within a first time window, and whether the second time difference falls within a second time window.

22 Claims, 10 Drawing Sheets

(56) References Cited

U.S. PATENT DOCUMENTS

| | | | |
|---|---|---|---|
| 2011/0038199 A1* | 2/2011 | Breitwisch | G11C 13/0004 365/163 |
| 2011/0110009 A1* | 5/2011 | Sugimoto | H03K 17/0822 361/93.1 |
| 2013/0063114 A1 | 3/2013 | Agrawal et al. | |
| 2013/0187656 A1 | 7/2013 | Barrenscheen et al. | |
| 2013/0314020 A1 | 11/2013 | Sugie | |
| 2015/0229215 A1 | 8/2015 | Choudhary et al. | |
| 2016/0006337 A1 | 1/2016 | Thalheim et al. | |
| 2016/0329808 A1 | 11/2016 | Han | |
| 2016/0344302 A1 | 11/2016 | Inoue et al. | |
| 2017/0288662 A1 | 10/2017 | Djelassi et al. | |

FOREIGN PATENT DOCUMENTS

| | | |
|---|---|---|
| WO | 2016137654 A1 | 9/2016 |
| WO | 2017070290 A1 | 4/2017 |

\* cited by examiner

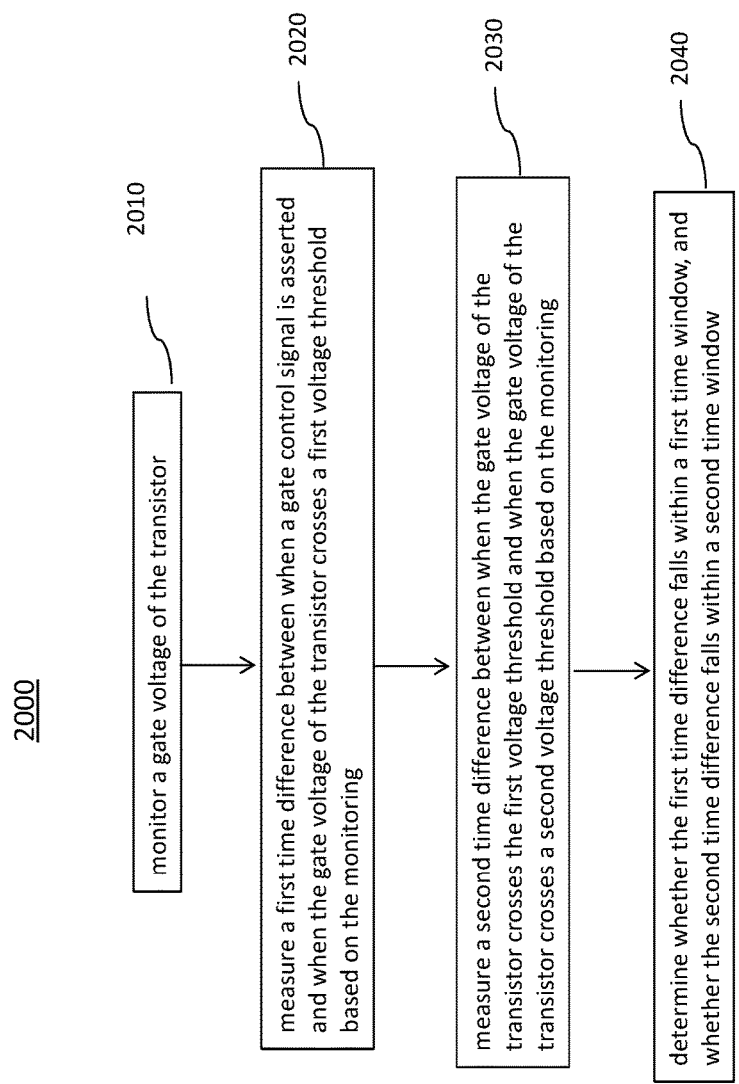

THREE LEVEL GATE MONITORING

TECHNICAL FIELD

This disclosure in general relates to electronic circuits and systems, and in particular, power control circuits and methods of operating the power control circuits.

BACKGROUND

A power control circuit may include a power management circuit, a driver circuit, control logic, diagnostic logic, or other circuits. The power management circuit may be used for generating and/or regulating power supply voltages. The driver circuit may be used to control devices that generate power, such as switch-mode power supplies, and can be used to control devices that consume power, such as motors. A motor driver can have a controller that generates a pulse-width modulated signal used to produce drive signals for driver switches for different phases of a motor. The pulse-width modulated signal can be generated based in-part on an internal oscillator of a component.

Power control circuits may be implemented on semiconductor substrates as integrated circuit (IC) chips, such as power control ICs. Due to the small footprint and energy efficiencies of power control ICs, power control ICs are widely used in various applications and products across different industries, e.g., such as consumer electronics, industrial control, medical equipment, aviation, and automotive.

Although semiconductor ICs generally have high reliability, device failure may still occur over time due to various reasons such as component aging, exposure to adverse environment (e.g., excessive heat, moisture, dust, mechanical stress), or improper usage (e.g., over-voltage or under-voltage). For mission critical applications such as automotive control, it is advantageous to detect device failure at early stage, such that safety procedures and/or protocols may be performed to remedy or alleviate the device failure. For example, redundancy circuits/devices may be activated to take over the functions of the failed devices.

SUMMARY

In accordance with an embodiment of the present invention, a method of monitoring a gate of a transistor includes monitoring a gate voltage of the transistor; measuring a first time difference between when a gate control signal is asserted and when the gate voltage of the transistor crosses a first voltage threshold based on the monitoring; measuring a second time difference between when the gate voltage of the transistor crosses the first voltage threshold and when the gate voltage of the transistor crosses a second voltage threshold based on the monitoring; and determining whether the first time difference falls within a first time window, and whether the second time difference falls within a second time window.

In accordance with an embodiment of the present invention, a circuit includes a gate monitoring circuit having a first input configured to receive a gate voltage of a transistor, and a second input configured to receive a gate control signal. The gate monitoring circuit includes a first comparator configured to compare the gate voltage of the transistor to a first voltage threshold; a second comparator configured to compare the gate voltage of the transistor to a second voltage threshold; and a timer circuit configured to: measure a first time difference between when a gate control signal is asserted and when an output of the first comparator is asserted, measure a second time difference between when the output of the first comparator is asserted and an output of the second comparator is asserted, determine whether the first time difference falls within a first time window, and whether the second time difference falls within a second time window, and generate an error signal when the first time difference falls outside of the first time window or when the second time difference falls outside of the second time window.

In accordance with an embodiment of the present invention, a power control integrated circuit (IC) includes a driver circuit having an output terminal configured to be electrically coupled to a control terminal of a power switch; and a gate monitoring circuit electrically coupled to the output terminal of the driver circuit. The gate monitoring circuit includes a first timer configured to measure a first time span, where the first time span is a duration between a first time instant the driver circuit is switched on or off to drive the power switch and a second time instant a control voltage at the output terminal of the driver circuit reaches a first pre-determined threshold; a second timer configured to measure a second time span, where the second time span is a duration between the second time instant and a third time instant the control voltage reaches a second pre-determined threshold; and a comparator configured to detect that the control voltage is above a third pre-determined threshold.

BRIEF DESCRIPTION OF THE DRAWINGS

For a more complete understanding of the present invention, and the advantages thereof, reference is now made to the following descriptions taken in conjunction with the accompanying drawings, in which:

FIG. 5 is a flow chart for a method of monitoring a gate of a transistor, in an embodiment.

Corresponding numerals and symbols in different figures generally refer to corresponding parts unless otherwise indicated. The figures are drawn to clearly illustrate the relevant aspects of the disclosed embodiments and are not necessarily drawn to scale.

DETAILED DESCRIPTION OF ILLUSTRATIVE EMBODIMENTS

The making and using of the presently disclosed embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely power control circuits and methods of operating the power control circuits.

In embodiments of the present invention, the gate voltage of a power switch (e.g., a transistor) is monitored during each switching event (e.g., switching on or off). In particular, the propagation time and the rise time of the gate voltage are measured during the turn-on process of the power switch, and are compared with respective time windows. If the measured propagation time or the measured rise time falls outside the respective time window, a fault condition is detected. Similarly, during the turn-off process of the power switch, the propagation time and the fall time of the gate voltage are measured, and are compared with respective time windows. If the measured propagation time or the measured fall time falls outside the respective time window, a fault condition is detected. In addition, the gate voltage is compared with a voltage threshold to detect an over-voltage condition. A fault condition is detected when the gate voltage is above the voltage threshold.

Figure 1A:
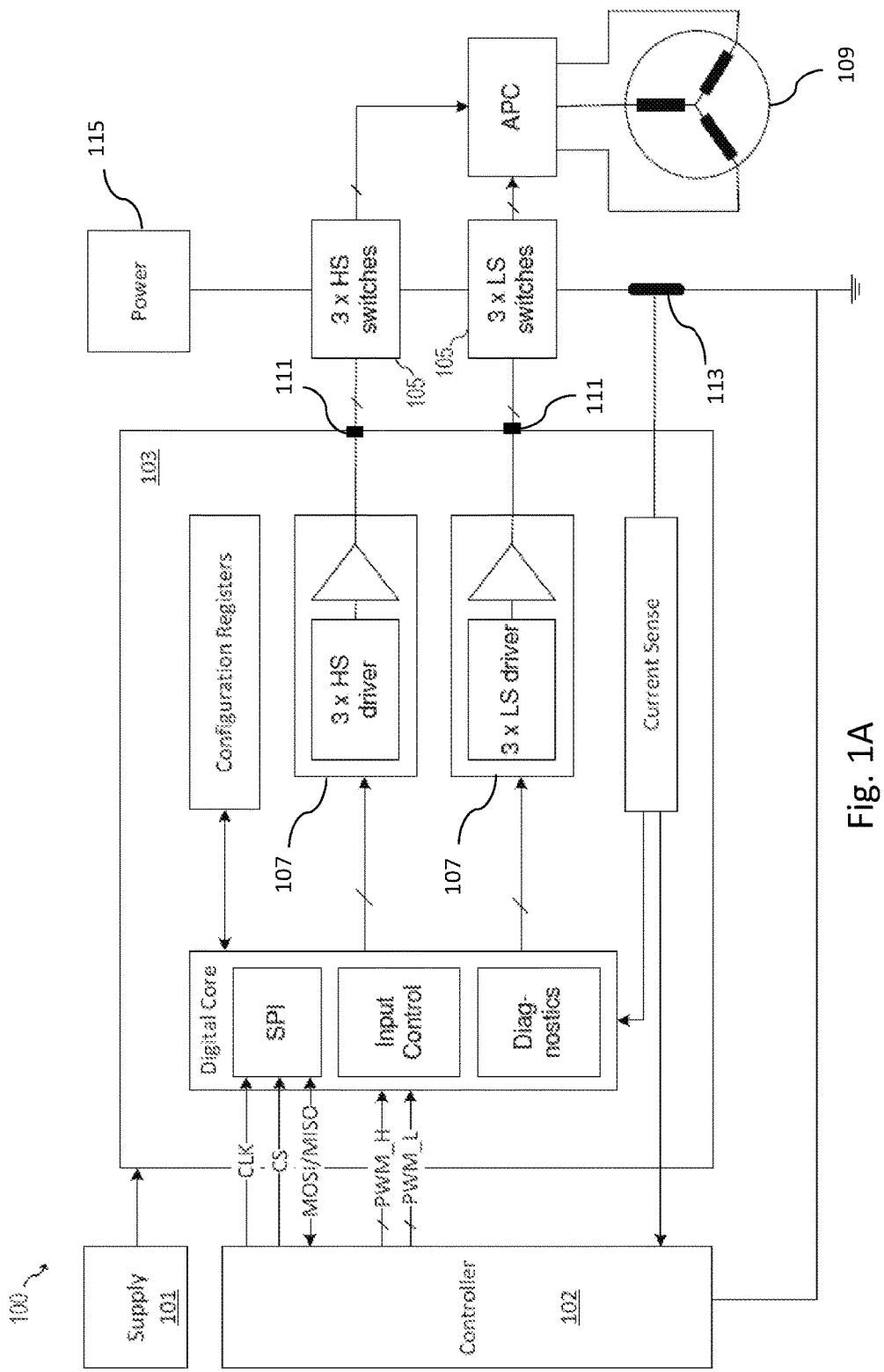
FIG. 1A illustrates a block diagram of a power control circuit, in some embodiments.

FIG. 1A illustrates an exemplary power control circuit 100 for driving a three-phase motor 109. One of ordinary skill in the art would understand that other connections and functions may exist within the diagram of FIG. 1A. For clarify, not all features of the power control circuit 100 are illustrated in FIG. 1A. The power control circuit 100 can be used, e.g., to operate an electronic power steering system or a power brake system in an automobile. The power control circuit 100 includes several modules, such as a supply IC 101, a controller 102, a pre-driver IC 103, and power switches 105. The supply IC 101 may be or include a power management IC used for generating and/or regulating power supply voltages for the pre-driver IC 103. The controller 102 may be a micro-processor, a central processing unit (CPU), an application specific integrated circuit (ASIC), or the like. The power switches 105 may be any suitable switches, such as field effect transistors (FETs) (e.g., metal-oxide-semiconductor field effect transistors (MOSFETs)), insulated-gate bipolar transistor (IGBTs), or the like. The discussion herein may refer to the power switches 105 as MOSFETs, with the understanding that any suitable power switches may be used. As illustrated in FIG. 1A, each of the three phases of the three-phase motor 109 is driven by a corresponding high side (HS) power switch (e.g., a MOSFET) 105 and a corresponding low side (LS) power switch (e.g., a MOSFET) 105. More details regarding the electrical connection of the power switches 105 are discussed hereinafter with reference to FIG. 1B.

As illustrated in FIG. 1A, the pre-driver IC 103 (may also be referred to as a driver IC, or a power control IC) has several logical blocks inside, such as a digital core block containing a communication interface (e.g., a serial peripheral interface (SPI) bus interface), an input control logic, and a diagnostic logic. A feedback block, such as a current sense block, provides feedback information from the three-phase motor 109 through the pre-driver IC 103 and back to the controller 102. Configuration registers allow configuration of configurable settings in pre-driver IC 103. The digital core produces two pulse width modulated (PWM) signals (for the high side and low side MOSFETs) for each of the three phases, totaling six PWM switching signals provided by way of three half-bridge drivers, with each half-bridge driver having two driver circuits 107, such as a high side (HS) driver and a low side (LS) driver. The driver circuit 107 may also be referred to as a gate driver circuit. The output (e.g., a control voltage) of each of the driver circuits 107 is sent to a respective output port 111 for controlling a corresponding power switch 105 (e.g., a HS power switch or a LS power switch). In some embodiments, the output of each of the driver circuit 107 is a differential signal, and therefore, each output port 111 in FIG. 1A may include two output terminals for the differential signal.

The controller 102 provides motor control via PWM signals PWM_H and PWM_L based on feedback from the current sense block of the pre-driver IC 103. The controller 102 can also operate as the bus master for the SPI bus. During operation, the controller 102 receives input that determines a desired speed and direction to operate the three-phase motor 109. The input on which the PWM signals are based can be, for example, an input telling the controller 102 to speed up the motor, slow down the motor, stop the motor, reverse direction of the motor, set the speed of the motor to a particular speed and direction, and so forth. For example, in the system of FIG. 1A, the input can be determined from a position sensor on a steering wheel shaft of an automobile. In some embodiments, the PWM signals are created by the controller 102 based on the input and based on the current condition and state of the three-phase motor 109, with the PWM signals created to change the state of the motor from a first state to a second state, where the second state is a state that is closer to a targeted state of the three-phase motor 109.

Figure 1B:
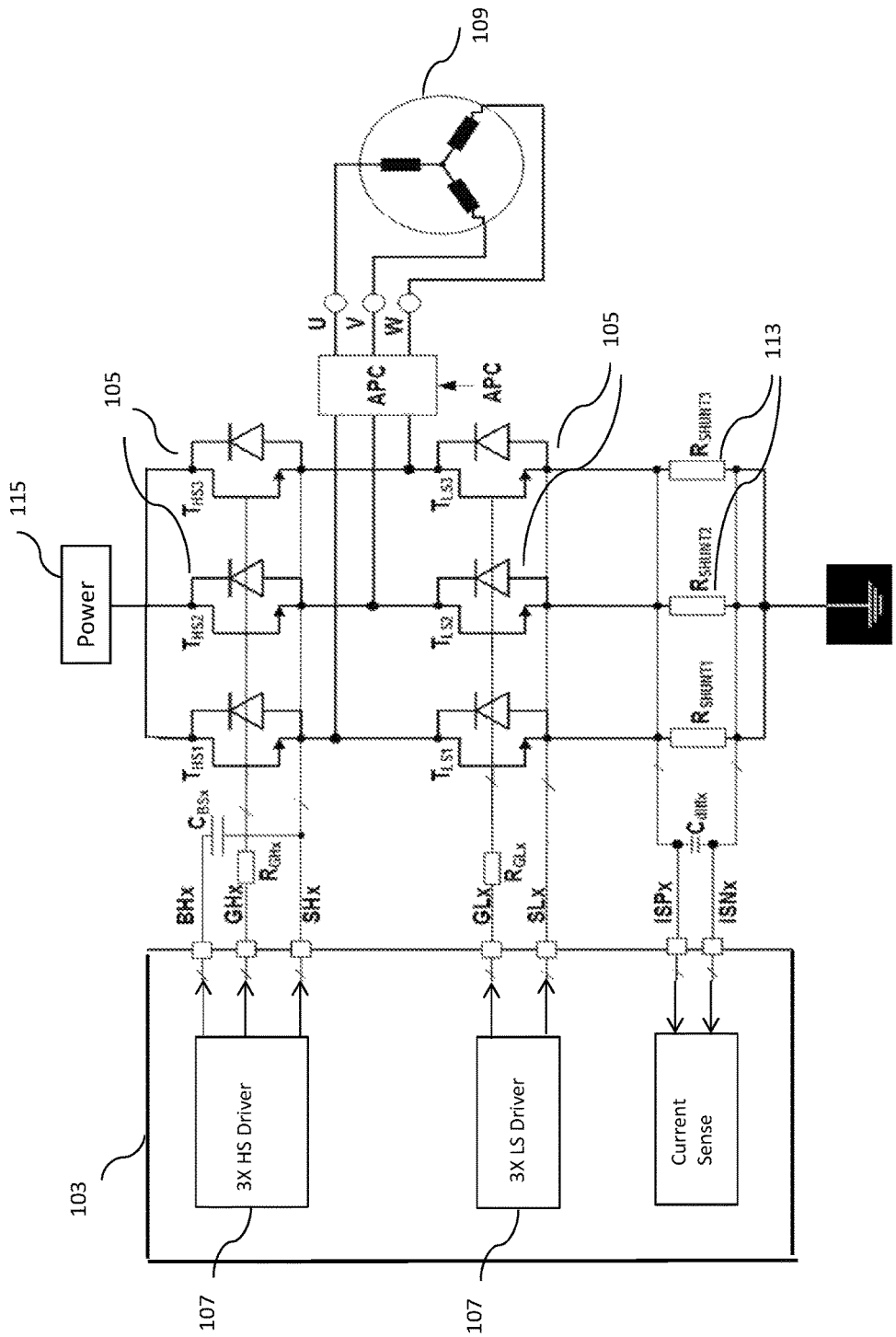
FIG. 1B is a block diagram of a portion of the power control circuit of FIG. 1A with additional details.

FIG. 1B illustrates more details of FIG. 1A, and particularly, details about the power switches 105 and the electrical connections between the power switches 105 and the pre-driver IC 103. Note that for clarity, not all features of the pre-driver IC 103 of FIG. 1A are repeated in FIG. 1B.

In FIG. 1B, each phase of the three-phase motor 109 is driven by a respective high side power switch $T_{HSX}$ and a respective low side power switch $T_{LSX}$, where X=1, 2, or 3. In other words, the HS power switches 105 and the LS power switches 105 of FIG. 1A correspond to the HS power switches $T_{HSX}$ and the LS power switches $T_{LSX}$ of FIG. 1B, respectively. The HS driver circuit 107 provides three control voltages (also referred to as output control voltages), one for each of the HS power switches $T_{HSX}$, where each of the three control voltages is provided between output terminals GHx and SHx, x=1, 2, or 3. Similarly, the LS driver circuit 107 provides three control voltages, one for each of the LS power switches $T_{LSX}$, where each of the three control voltages is provided between output terminals GLx and SLx, x=1, 2, or 3. As illustrated in FIG. 1B, the output terminals GHx and SHx are electrically coupled to a gate and a source of a respective HS power switches $T_{HSX}$ (x=1, 2, or 3), respectively. In addition, the output terminals GLx and SLx are electrically coupled to a gate and a source of a respective LS power switches $T_{LSX}$ (x=1, 2, or 3), respectively. The gate of the power switch (e.g., $T_{HSX}$, $T_{LSX}$) may also be referred to as a control terminal of the power switch. In the illustrated embodiment, the output control voltage of each of the driver circuits 107 corresponds to a gate-source voltage of a respective power switch 105 (e.g., $T_{HSX}$ or $T_{LSX}$). In the example of FIG. 1B, there is a resistor (e.g., $R_{GHX}$ or $R_{GLX}$) between an output terminal (e.g., GHx or GLx) of the driver circuit 107 and the gate of the corresponding power switch 105. Since the power switch 105 (e.g., a CMOS transistor) draws substantially no gate current, the output control voltage of the driver circuit 107 is substantially the same as the gate-source voltage of the power switches. Therefore, in the discussion herein, the output control voltage from each of the driver circuit 107 may also be referred to as the gate-source voltage $V_{GS}$ of the respective power switches 105.

For ease of discussion herein, a notation of Gxx and Sxx is used to denote a pair of output terminals of the driver circuit 107, such as a pair of output terminals GHx and SHx of the HS driver circuit 107, or a pair of output terminals GLx and SLx of the LS driver circuit 107, where x=1, 2, or 3. Therefore, the gate-source voltage $V_{GS}$ each of the power switches 105 is measured between respective terminals Gxx and Sxx.

Still referring to FIG. 1B, drains of the HS power switches $T_{HSX}$ are electrically coupled to a power supply 115 (e.g., a voltage supply). The power supply 115 is different (e.g., independent) from the supply IC 101 (see FIG. 1A). Having different power supplies for the power switches 105 and the pre-driver IC 103 allows the pre-driver IC 103 to function properly, regardless of the status of the power supply 115.

Sources of the LS power switches $T_{LSX}$ are electrically coupled to a reference voltage level (e.g., electrical ground) through shunt resistors 113 (labeled as $R_{SHUNTX}$, X=1, 2, or 3). The current sense block monitors the current of each half-bridge by monitoring the voltage drop across each of the shunt resistors 113, as illustrated in FIG. 1B. The resistance of each the shunt resistors 113 may be between, e.g., about 0.5 mΩ to about 1 mΩ, although other values are also possible. For power steering applications, the current flowing through the shunt resistors may be between, e.g., a few amps to about 180 A, as examples.

Figure 2A:
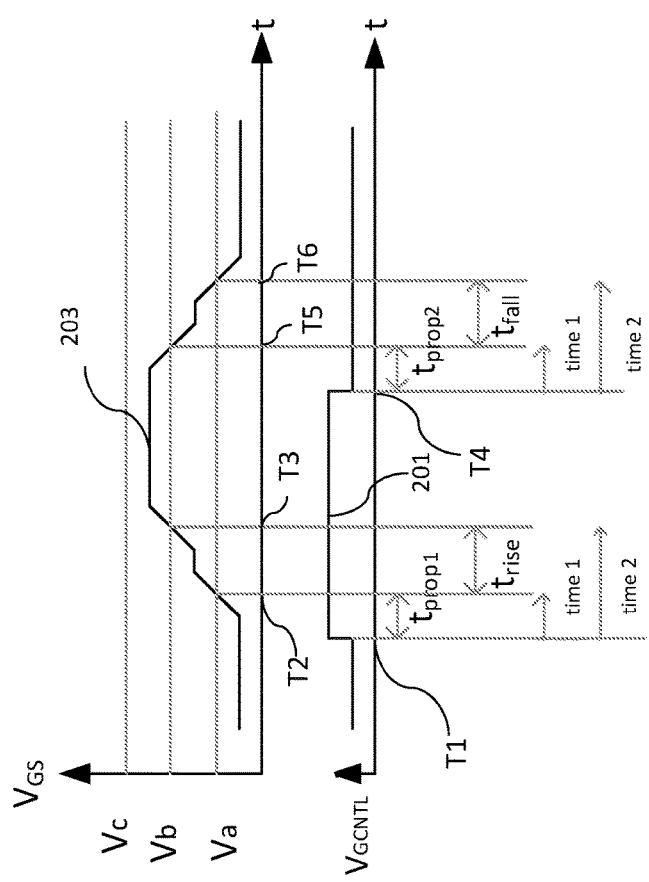
FIG. 2A is a timing diagram illustrating a gate voltage of a power switch, in some embodiments.

FIG. 2A illustrates a timing diagram for the gate-source voltage $V_{GS}$ of the power switch 105 (e.g., a MOSFET) during normal operation, in some embodiments. The timing diagram between time T1 and time T3 illustrates a process to turn on the power switch 105 (also referred to as a turn-on process), and the timing diagram between time T4 and time T6 illustrates a process to turn off the power switch 105 (also referred to as a turn-off process). In FIG. 2A, the curve 203 in the top plot shows the gate-source voltage $V_{GS}$, and the curve 201 in the lower plot shows a gate control signal $V_{GCNTL}$ used to turn on or off the driver circuits 107 (thus also turning on or off the power switches 105). The gate control signal $V_{GCNTL}$ may be derived from the PWM signals (PWM_H and PWM_L). The time (e.g., the t-axis) of the top plot and of the lower plot are aligned in FIG. 2A.

Referring to FIG. 2A, the driver circuit 107 and the power switch 105 connected to the driver circuit 107 are in an OFF state initially. Next, at time T1, the controller 102 turns on the driver circuits 107 by asserting the gate control signal $V_{GCNTL}$. The gate-source voltage $V_G$S starts to rise after a short delay. At time T2, the gate-source voltage $V_{GS}$ reaches (e.g., crosses above) a voltage threshold Va, and the power switch 105 starts to turn on. In some embodiments, the voltage threshold Va is a voltage below which the power switch 105 stays in an OFF state (e.g., no current flows through the power switch 105). Therefore, a voltage range comprising voltages smaller than the voltage threshold Va is referred to as a safe operation area (SOA) of the power switch 105. The voltage threshold Va for a MOSFET used as the power switch 105 may be around 1.7 V, as an example. The time span between time T1 and time T2 may be referred to as the propagation time $T_{prop1}$ of the driver circuit 107, since $T_{prop1}$ corresponds to a duration for the gate control signal $V_{GCNTL}$ (asserted at time T1) to propagate through the driver circuit 107 and appear (at time T2) at the output terminals of the driver circuit 107 with a voltage large enough to start turning on the power switch 105, in some embodiments.

After time T2 and before time T3, the gate-source voltage $V_{GS}$ continues to rise, but is below a voltage threshold Vb, which is a voltage for the power switch 105 to be fully turned on. For a MOSFET power switch, the voltage threshold Vb may be around 6.5 V, as an example. Therefore, between time T2 and time T3, the power switch 105 is in the process of being switched from OFF to ON, e.g., between the OFF state and the ON state. In embodiments where MOSFETs are used as the power switches 105, the MOSFETs may be in a saturated region between time T2 and time T3, where the current flowing through each of the MOSFETs is modulated by the gate-source voltage $V_{GS}$. In some circumstances, a high amount of heat may be generated when the power switches 105 (e.g., MOSFETs) are in the saturated region, and damage to the power switches 105 may occur. For this reason, the voltage region between Va and Vb (e.g., Va≤V<Vb) may be referred to as an unstable operation area of the power switches. The time span between time T2 and T3 is referred to as the rise time $T_{rise}$ of the power switch 105.

Next, at time T3, the gate-source voltage $V_{GS}$ reaches (e.g., crosses above) the voltage threshold Vb, the power switch 105 is now fully turned on and leaves the instable operation area. FIG. 2A also shows a voltage threshold Vc, which corresponds to a high voltage value above which damage to the power switch 105 may occur due to overvoltage. For power switches 105 using MOSFETs, the voltage threshold Vc may be around 16 V, as an example. When the gate-source voltage $V_{GS}$ is between Vb and Vc, the power switch 105 may operate safely, and thus, the voltage region between Vb and Vc (e.g., Vb≤V<Vc) may be referred to as another safe operation area of the power switch. Each of the voltage thresholds Va, Vb, and Vc may also be a pre-determined threshold.

Next, at time T4, the controller 102 turns off the driver circuit 107 by de-asserting the gate control signal $V_{GCNTL}$, and the gate-source voltage $V_{GS}$ starts to decrease after a short delay. At time T5, the gate-source voltage $V_{GS}$ reaches (e.g., crosses below) the voltage threshold Vb, the power switch 105 leaves the safe operation area and starts to turn off. The time span between time T4 and time T5 is referred to as a propagation time $T_{prop2}$, which may or may not be the same as the propagation time $T_{prop1}$, depending on, e.g., characteristics of the power switch 105.

During time T5 and time T6, the power switch 105 is in the unstable operation area as the gate-source voltage $V_{GS}$ decreases. At time T6, the gate-source voltage $V_{GS}$ reaches (e.g., crosses below) the voltage threshold Va, and the power switch 105 enters the OFF state. The time span between time T5 and time T6 is referred to as the fall time $T_{fall}$ of the power switch 105.

In normal operation, during the turn-on process, the propagation time $T_{prop1}$ and the rise time $T_{rise}$ each are within a respective pre-determined time window, which pre-determined time window is determined by, e.g., the driving capability of the driver circuits 107, the physical characteristics of the power switches 105, or the load connected to the power switches 105. Similarly, during the turn-off process, the propagation time $T_{prop2}$ and the fall time $T_{fall}$ each are within a respective pre-determined time window. For example, the propagation time $T_{prop1}$ (or $T_{prop2}$) may be within a pre-determined time window between about 20 ns and about 300 ns, and the rise time $T_{rise}$ (or the fall time $T_{fall}$) may be within a pre-determined time window between about 200 ns and about 400 ns.

When a fault condition occurs, the propagation times $T_{prop1}$ and $T_{prop2}$, the rise time $T_{rise}$, and/or the fall time $T_{fall}$ may be affected and fall outside the respective pre-determined time window. Fault conditions may occur due to, e.g., the power switch 105 being damaged, load (e.g., the three-phase motor 109) not connected correctly (e.g., broken wire) to the power switch 105, or the driver circuit 107 having malfunction thus not providing proper driving capability, as examples. The propagation times $T_{prop1}$ and $T_{prop2}$, the rise time $T_{rise}$, and the fall time $T_{fall}$ may be monitored by monitoring the gate of the power switch 105 (e.g., a transistor), e.g., by monitoring the gate voltage (the gate source voltage $V_GS$) of the power switch 105.

By monitoring the propagation times $T_{prop1}$ and $T_{prop2}$, the rise time $T_{rise}$, and/or the fall time $T_{rise}$, fault conditions in the power control circuits 100 may be detected. For example, the propagation time $T_{prop1}$ (or $T_{prop2}$) may be used to insure that the pre-driver IC 103 is performing the switching on/off operation (e.g., switching the driver circuit 107 on and off) correctly. Comparing the propagation time $T_{prop1}$ (or $T_{prop2}$) with the respective pre-determined time window allows for checking that the gate control signal is propagated correctly through the pre-driver IC 103 to the power switches 105, and that the power switches 105 are connected correctly to the output pads (e.g., pads connected to the three-phase motor 109). The propagation time $T_{prop1}$ (or $T_{prop2}$) also allows for checking that the pre-driver IC 103 has the correct driver strength, and that the connected power switches 105 are the correct type of power switches.

Similarly, the rise time $T_{rise}$ may be used to monitor the reaction of the power switches 105 driven by the driver circuits 107. Particularly, the rise time $T_{rise}$ may be used to check that the power switches 105 are switching correctly (e.g., the rise time is within the respective pre-determined time window), and that a load is properly attached to the power switches 105. For example, a damaged power switch 105 or an insufficient driving capability of the driver circuit 107 may cause the measured rise time $T_{rise}$ to be larger than the upper limit of the pre-determined time window for $T_{rise}$. As another example, when the power switch 105 is not present (e.g., due to a short circuit), the measured rise time $T_{rise}$ may be smaller than the lower limit of the pre-determined time window for $T_{rise}$. The fall time $T_{fall}$ may be used in similar ways as the rise time $T_{rise}$ to check that the power switch 105 is switching correctly (e.g., the fall time is within the respective pre-determined time window), and that a load is properly attached to the power switches 105.

Once a fault condition is detected, the power control circuits 100 may generate or assert an error signal to report the fault condition to, e.g., the controller 102. A safe state sequence (a pre-determined sequence of operations) may be carried out to bring the power control circuit 100 to a safe state when the error signal is asserted. The safe state is entered to avoid catastrophic failure (e.g., the steering wheel of the automobile being locked up and not able to steer) due to the fault condition of the power control circuits 100. The definition of the safe state is application specific (e.g., determined by the type of systems or applications the power control circuit 100 is used for), and may refer to a state in which the power control circuit 100 may stay, e.g., temporarily until the fault condition is repaired, a redundancy circuit takes over the failed functionalities, or until it is safe to shut down the power control circuit 100. For example, for a power control circuit 100 that is used to drive a three-phase motor 109 for the power steering wheel of an automobile, if a fault condition is detected (e.g., error signal asserted) that is due to the power switch 105 in one of the three-phases being broken (e.g., open circuit), the safe state may be reached by switching off the power switches 105 in other two phases of the three-phase motor, in which case the steering wheel loses the power assist, but the driver of the automobile is still able to steer the steering wheel. Such an operation state may be referred to as a limp home state. As another example, consider a power control circuit 100 that is used to drive a 12-phase starter motor. When a fault condition is detected that indicates one of the power switches 105 in one of the twelve phases is damaged (e.g., open circuit), it may not be safe to turn off the power switches 105 in the other phases right away, because the motor may still be rotating at high speed and may have high kinetic energy. Turning off all of the power switches 105 right away may cause the motor to operate in a generator mode and may cause a high voltage to be generated at the power switches 105, which high voltage may damage the power switches 105. Therefore, for the 12-phase starter motor application, the safe state sequence includes keeping the non-damaged power switches 105 on while gradually reducing the driving voltage supplied by the driver circuits 107, and after the motor speed reduces to a safe level, turning off the power switches 105 to stop the 12-phase starter motor.

In some embodiments, the diagnostic logic of the power control circuit 100 measures the propagation time $T_{prop1}$ and the rise time $T_{rise}$ during the turn-on process of the power switch 105, and compares the measured propagation time $T_{prop1}$ and the measured rise time $T_{rise}$ with a respective pre-determined time window. A fault condition is detected when the measured propagation time $T_{prop1}$ or the measured rise time $T_{rise}$ falls outside the respective pre-determined time window. In some embodiments, the propagation time $T_{prop1}$ and the rise time $T_{rise}$ are measured each time the power switch 105 is turned on, thereby allowing for real-time monitoring of the power control circuit 100.

In some embodiments, the diagnostic logic of the power control circuit 100 measures the propagation time $T_{prop2}$ and the fall time $T_{fall}$ during the turn-off process of the power switch 105, and compares the measured propagation time $T_{prop2}$ and the measured fall time $T_{fall}$ with a respective pre-determined time window. A fault condition is detected when the measured propagation time $T_{prop2}$ or the measured fall time $T_{fall}$ falls outside the respective pre-determined time window. In some embodiments, the propagation time $T_{prop2}$ and the fall time $T_{fall}$ are measured each time the power switch 105 is turned off, thereby allowing for real-time monitoring of the power control circuit 100.

In some embodiments, the diagnostic logic of the power control circuit 100 measures the propagation time $T_{prop1}$ and the rise time $T_{rise}$ during the turn-on process, and measures the propagation time $T_{prop2}$ and the fall time $T_{fall}$ during the turn-off process. A fault condition is detected when any of the above measured time falls outside the respective pre-determined time window. In some embodiments, the propagation time $T_{prop1}$, the rise time $T_{rise}$, the propagation time $T_{prop2}$, and the fall time $T_{fall}$ are measured each time the power switch 105 is turned on or off, thereby allowing for real-time monitoring of the power control circuit 100.

Figure 2B:
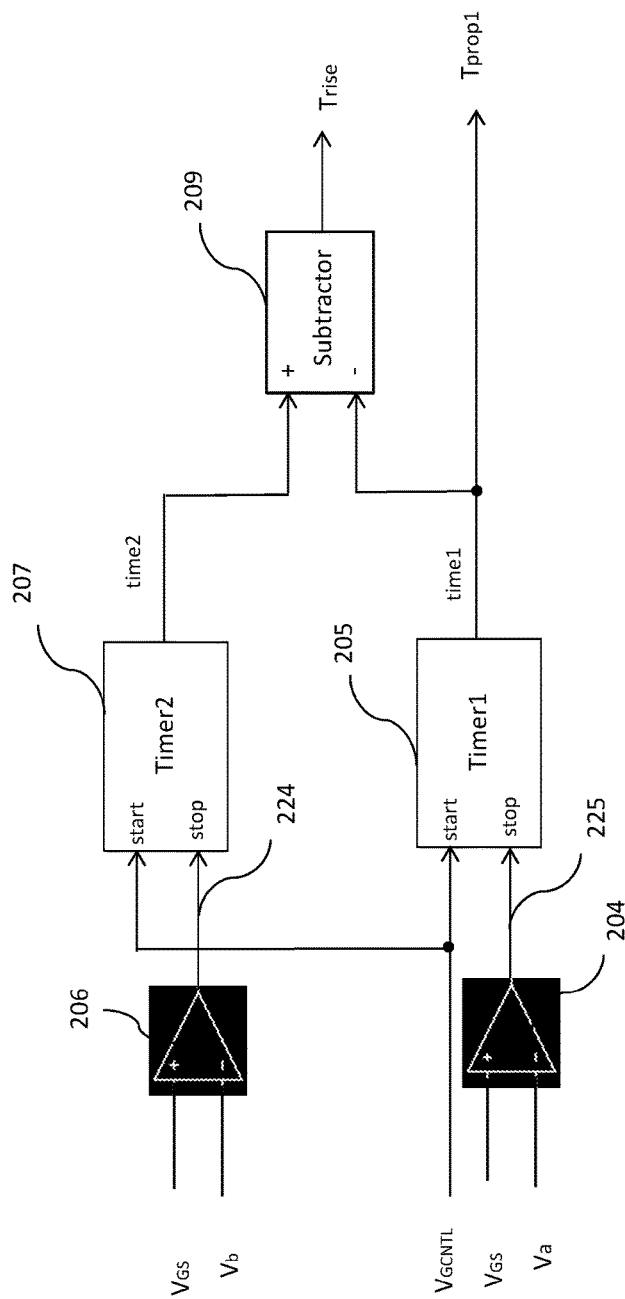
FIGS. 2B, 2C, and 2D illustrate various embodiment circuits for measuring the switching times illustrated in FIG. 2A.
Figure 2C:
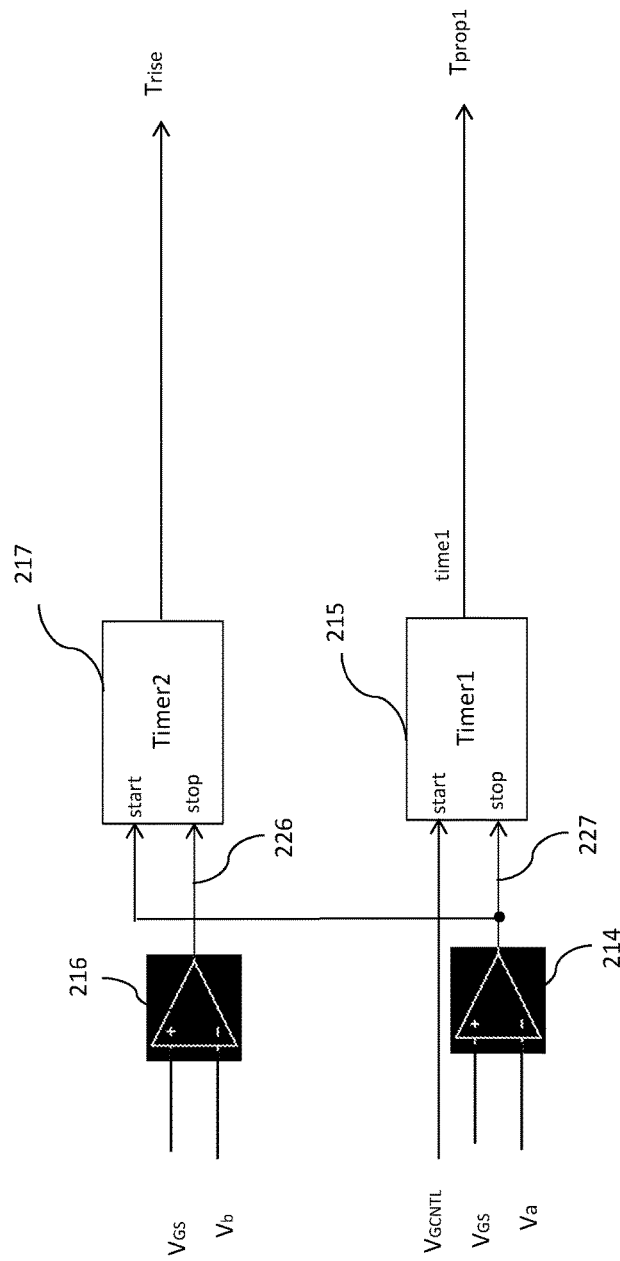

Measurement of the propagation time $T_{prop1}$, the rise time $T_{rise}$, the propagation time $T_{prop2}$, and the fall time $T_{fall}$ may be performed using timers. For example, for each of the power switches 105, two timers may be used to measure, e.g., the propagation time $T_{prop1}$ and the rise time $T_{rise}$ during the turn-on process of the power switch 105. The same two timers may be used to measure the propagation time $T_{prop2}$ and the fall time $T_{fall}$ during the turn-off process. FIGS. 2B and 2C illustrate two embodiment circuits for measuring the switching time (e.g., $T_{prop1}$, $T_{prop2}$, $T_{rise}$, $T_{fall}$), details of which are discussed hereinafter.

Figure 3A:
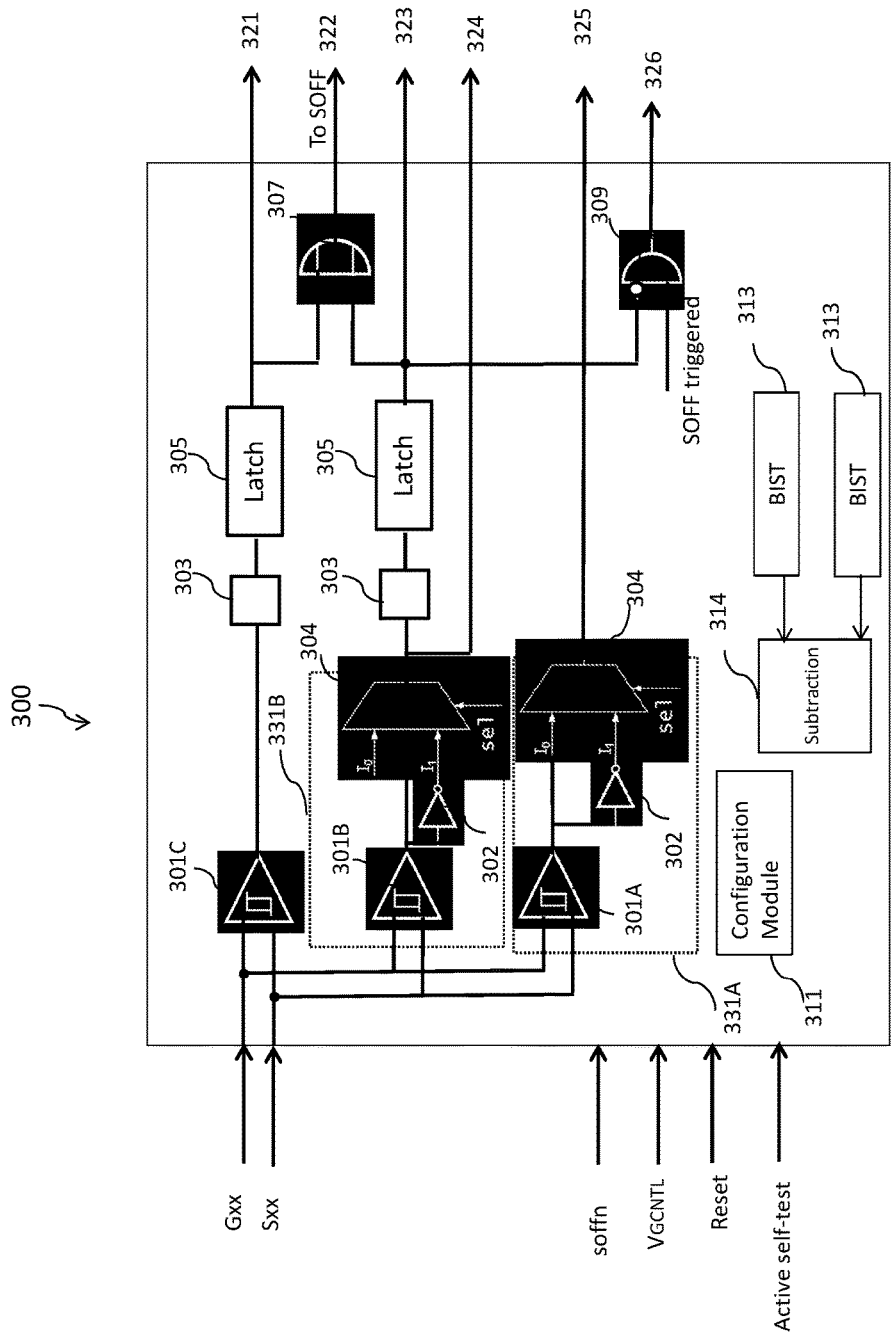
FIG. 3A illustrates a block diagram of a gate monitoring circuit, in some embodiments.

Measurement of the propagation time $T_{prop1}$ and $T_{prop2}$, the rise time $T_{rise}$ and the fall time $T_{fall}$ may be performed in different ways using the timers. FIG. 2B illustrates an example circuit where, during the turn-on process, a first timer 205 is used to measure a time span time1 (see FIG. 2A) between time T1 and time T2, and a second timer 207 is used to measure a time span time2 (see FIG. 2A) between time T1 and time T3. In particular, both the first timer 205 and the second timer 207 are triggered at time T1 by the rising edge of the gate control signal $V_{GCNTL}$ to start counting the time. The first timer 205 is stopped by a trigger signal at time T2 by a signal 225 that indicates the gate-source voltage $V_{GS}$ crossing (e.g., rising above) the voltage threshold Va. The second timer 207 is stopped by another trigger signal at time T3 by a signal 224 that indicates the gate-source voltage $V_{GS}$ crossing the voltage threshold Vb. The trigger signals 225 and 224 are generated by comparing the gate-source voltage $V_{GS}$ with the voltage thresholds Va and Vb, respectively, using comparators 204 and 206. The measured time span time1 corresponds to the propagation time $T_{prop1}$, and the difference between the measured time spans time2 and time1, calculated using a subtractor 209, corresponds to the rise time $T_{rise}$. Although not shown, during the turn-off process, the first timer 205 and the second timer 207 may both be triggered to start counting the time at time T4 (e.g., by the falling edge of the gate control signal $V_{GCNTL}$, see FIG. 2A), and thereafter, the first timer 205 and the second timer 207 may be triggered to stop counting the time at time T6 and time T5, respectively, by a respective trigger signal (not shown). Note that additional circuits may be used to generate the trigger signals for the timers (e.g., 205, 207) during the turn-off process. An example for generating the trigger signals for the turn-off process is shown in FIG. 3A (see the discussion hereinafter regarding comparator modules 331A/331B). The first timer 205 and the second timer 207 are initialized (e.g., set to a zero value) before start counting the time, in the illustrate embodiment.

Variations to the method for measuring the propagation time, the rise time and the fall time are possible and are fully intended to be included within the scope of the present disclosure. Referring to the example circuit of FIG. 2C, during the turn-on process, the first timer 215 is used to measure the propagation time $T_{prop1}$ directly using trigger signals similar to those of the first timer 205 in FIG. 2A. However, unlike FIG. 2A, the second timer 217 is configured to measure the rise time $T_{rise}$ directly by choosing a trigger signal 227, which is the trigger signal to stop the first timer 215, to start the second time 217. The second timer 217 is then stopped by a trigger signal 226 which indicates that the gate-source voltage $V_{GS}$ crosses the threshold voltage Vb. The trigger signals 227 and 226 are generated by comparing the gate-source voltage $V_{GS}$ with the voltage thresholds Va and Vb, respectively, using comparators 214 and 216. Although not shown in FIG. 2C, the first timer 215 and the second timer 217 may be used to directly measure the propagation time $T_{prop2}$ and the fall time $T_{fall}$ in the turn-off process.

In addition, it is possible to use only one timer to measure the propagation time $T_{prop1}$, the rise time $T_{rise}$, the propagation time $T_{prop2}$, and the fall time $T_{fall}$. This might be achieved by, e.g., reading out the timer value at the end of the propagation time ($T_{prop1}$ or $T_{prop2}$), and restarting the timer right after reading out the timer value to measure the next time period (rise time $T_{rise}$ or fall time $T_{fall}$). Other numbers of timers may also be used and are fully intended to be included within the scope of the present disclosure.

Figure 2D:
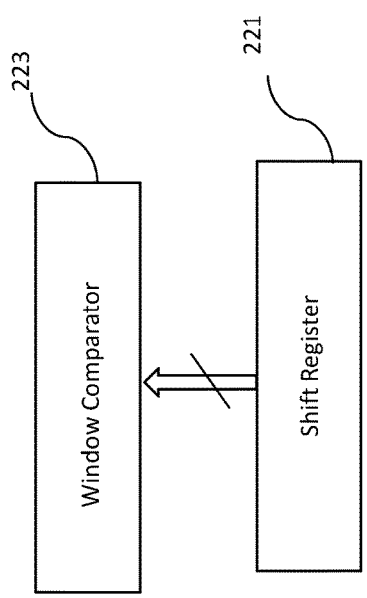

A timer (e.g., 205, 207, 215, 217) may be implemented in various ways, e.g., as a counter, or as a shift register. FIG. 2D illustrates a timer implemented as a shift register 221. The shift register 221 may be implemented as a delay line formed by a plurality of serially concatenated delay components (e.g., D-flip flops). FIG. 2D further illustrates a window comparator 223 coupled to the shift register 221. The window comparator 223 may be formed as a part of the circuit of the timer, or may be formed outside the timer. The output of the shift register 221 (e.g., outputs of the D flip-flops) is sent to the window comparator 223 and compared with a pre-determined time window. The window comparator 223 outputs a status signal to indicate if the time span measured by the shift register 221 is within the pre-determined time window, in some embodiments. The structures and principles discussed above with reference to FIGS. 2A-2D may be used to implement timers used in a monitoring circuit, such as gate monitoring circuit 300 of FIG. 3A.

Figure 3B:
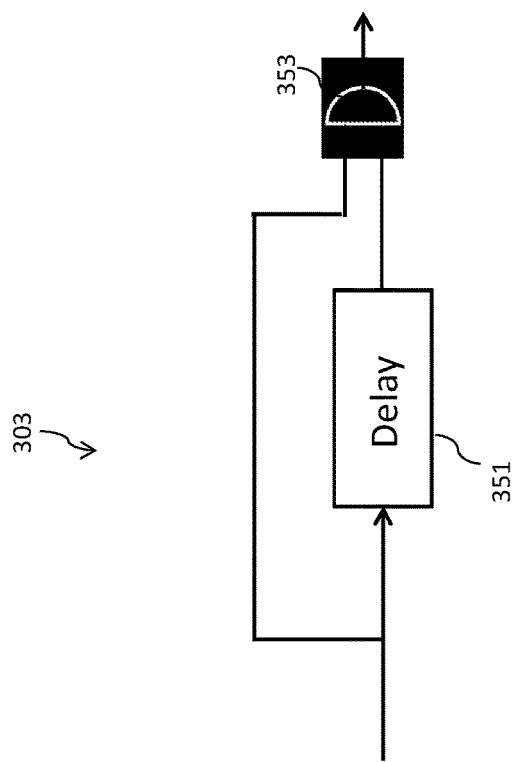
FIG. 3B illustrates a de-glitch circuit of FIG. 3A, in some embodiments.
Figure 4:
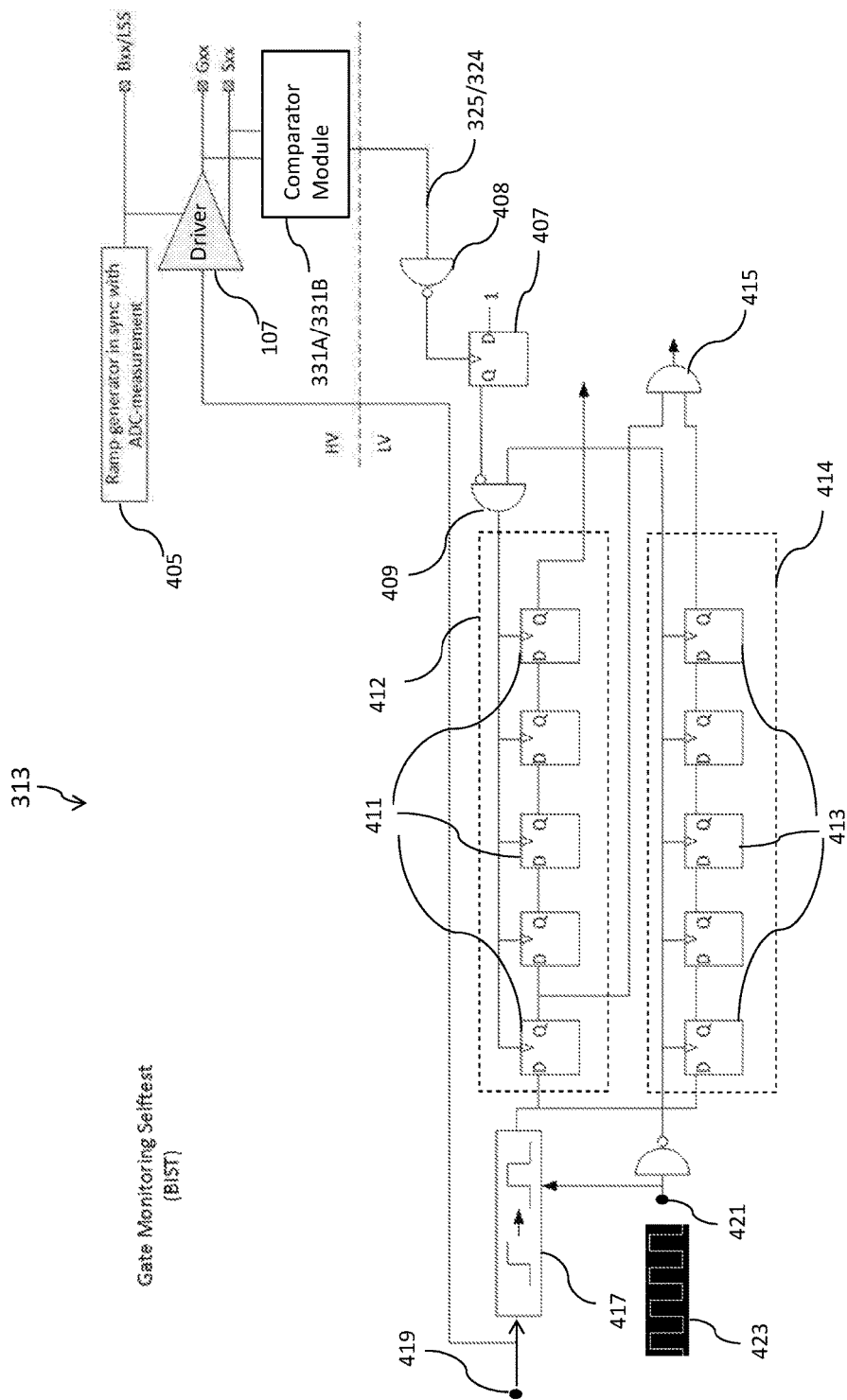
FIG. 4 is an exemplary block diagram of a gate monitoring self-test (BIST) circuit.

FIGS. 3A, 3B, and 4 illustrate an example of a gate monitoring circuit 300 using a shift register (see 412 in FIG. 4) to form the timer. The gate monitoring circuit 300 may be a part of the diagnostic logic of the power control circuit 100 in FIG. 1A. The example illustrated in FIGS. 3A, 3B, and 4 are for illustration purpose and not limiting, other implementation are also possible and are fully intended to be included within the scope of the present disclosure. For example, one skilled in the art will appreciate that counters may be used in place of the registers to form the timers.

Referring now to FIG. 3A, FIG. 3A is an exemplary block diagram of the gate monitoring circuit 300. In some embodiments, the gate monitoring circuit 300 monitors the status of the power control circuit 100 and detects fault conditions by monitoring the propagation times $T_{prop1}$ and $T_{prop2}$, the rise time $T_{rise}$ and/or the fall time $T_{fall}$, as discussed above with reference to FIG. 2A.

As illustrated in FIG. 3A, the gate monitoring circuit 300 has three comparators 301 (e.g., 301A, 301B, and 301C). The input to each of the comparator 301 includes the gate-source voltage $V_{GS}$ (e.g., voltage between a pair of output terminals Gxx and Sxx) at the output of the driver circuit 107 of FIGS. 1A and 1B. In some embodiments, each of the driver circuit 107 has a gate monitoring circuit 300 connected thereto. Therefore, for the example of FIGS. 1A and 1B, the diagnostic logic includes six instances of the gate monitoring circuit 300 (one for each of the six driver circuits 107), where each of the six instances of the gate monitoring circuit 300 is connected to the output terminals (e.g., GHx and SHx, or GLx and SLx) of a respective driver circuit 107.

The comparator 301A, 301B, and 301C compare the gate-source voltage $V_{GS}$ with voltage thresholds Va, Vb, and Vc, respectively, where Va, Vb, Vc are the voltage thresholds discussed above with reference to FIG. 2A. Particularly, the comparator 301C is used to detect an over-voltage fault condition and generate an error signal by comparing the gate-source voltage $V_{GS}$ with the voltage threshold Vc and outputting a logic "1" when $V_{GS}$ is above Vc. The output of the comparator 301C is sent to a de-glitch circuit 303, and the output of the de-glitch circuit 303 is latched by a latch 305 (e.g., a flip-flop). The output of the latch 305 is denoted as a signal 321, which signal 321 may be used to indicate an over-voltage fault condition, and/or to initiate the safe state sequence to bring the power control circuit 100 into a safe state.

The de-glitch circuit 303 is used to avoid false detection of the over-voltage fault condition. In some embodiments, the de-glitch circuit 303 provides a filtered output (e.g., smoothed output, or low pass filtered output) of the comparator 301C, thereby reducing the possibility that a spurious spur in the output of the comparator 301 causes a false detection of over-voltage. FIG. 3B illustrates an example of the de-glitch circuit 303, where the de-glitch circuit 303 includes a delay element 351 (e.g., one or more D flip-flops serially concatenated) and an AND gate 353. The input signal and a delayed version of the input signal are sent to input terminals of the AND gate 353. The output of the AND gate 353 provides de-glitched version of the input signal. Other implementations of the de-glitch circuit are also possible and are fully intended to be included within the scope of the present disclosure.

Referring back to FIG. 3A, the comparator 301A and comparator 301B compare the gate-source voltage $V_{GS}$ with voltage thresholds Va and Vb, respectively. When the gate-source voltage $V_{GS}$ is greater than or equal to the corresponding reference voltage (e.g., Va or Vb), the comparator 301A or 301B outputs a logic "1." The output of the comparator 301A is sent to a first input terminal $I_0$ of a multiplexer (MUX) 304 and to an inverter 302. The output of the inverter 302 is sent to a second input terminal $I_1$ of the MUX 304. The selector sel of the MUX 304 is configured to select, as output of the MUX 304, the input signal at the first input terminal $I_0$ during the turn-on process; and configured to select, as output of the MUX 304, the input signal at the second input terminal $I_1$ during the turn-off process. In some embodiments, after the turn-on process, the selector sel of the MUX 304 remain unchanged (e.g., selecting the input at $I_0$ as output) until the turn-off process starts. Therefore, during the turn-on process, the signal 325 of the gate monitoring circuit 300 is asserted (e.g., turns from logic "0" to logic "1") when the gate-source voltage $V_{GS}$ crosses (e.g., rises above) the voltage threshold Va (e.g., at time T2 in FIG. 2A); during the turn-off process, the signal 325 is asserted when the gate-source voltage $V_{GS}$ crosses (e.g., decrease below) the voltage threshold Va (e.g., at time T6 in FIG. 2A). Therefore, for the example of FIG. 2A, the signal 325 (e.g., a rising edge of the signal 325) may be used as a trigger signal to stop the timer used to measure the time span time1 during the turn-on process, and may be used as a trigger signal to stop the timer used to measure the time span time2 during the turn-off process.

Still referring to FIG. 3A, the output of the comparator 301B is connected to MUX 304 and to inverter 302, and the selector sel of the MUX 304 selects the output of the MUX 304 in similar ways as that of the MUX 304 connected to the comparator 301A. One skilled in the art will ready appreciate that during the turn-on process, the signal 324 at the output of the MUX 304 is asserted when the gate-source voltage $V_{GS}$ crosses (e.g., rises above) the voltage threshold Vb (e.g., at time T3 in FIG. 2A); during the turn-off process, the signal 324 is asserted when the gate-source voltage $V_{GS}$ crosses (e.g., decrease below) the voltage threshold Vb (e.g., at time T5 in FIG. 2A). Therefore, for the example of FIG. 2A, the signal 324 (e.g., a rising edge of the signal 324) may be used as a trigger signal to stop the timer used to measure the time span time2 during the turn-on process, and may be used as a trigger signal to stop the timer used to measure the time span time1 during the turn-off process. For ease of discussion, the comparator 301A (or 301B) and the inverter 302/MUX 304 connected thereto are collectively referred to as a comparator module 331A (or 331B).

As illustrated in FIG. 3A, the signal 324 is sent to a de-glitch circuit 303, and the output of the de-glitch circuit 303 is sent to a latch 305. The output of the latch 305 is denoted as a signal 323. Additional status/control signals, such as signals 322 and 326, may be generated using an OR gate 307 and an AND gate 309. The signal 322 may be used as a control signal to switch off the power switch 105 due to over-voltage, and the signal 326 may be used to detect an error condition that the power switch 105 is not being switched off properly (e.g., despite the signal 322 being asserted). In some embodiments, by checking the status/control signals (e.g., 321, 323, 324, and/or 325) of the gate monitoring circuit 300, the controller 102 or the diagnostic logic monitors the state of the power switches 105 and determines the state of the power switches 105. For example, after the turn-on process is started, if the signal 324 is logic "1" and the signal 321 is logic "0," the power switch 105 is in the ON state and is operating in the safe operation area.

In some embodiments, the voltage thresholds Va, Vb, and Vc are programmable, e.g., by the controller 102. The values of the voltage thresholds Va, Vb, and Vc, or indicators that indicate the choices for the voltage thresholds Va, Vb, and Vc, are stored in a configuration module 311 of the gate monitoring circuit 300, which configuration module 311 may comprise memories such as random access memories (RAMs), read-only memories (ROMs), the like, or combinations thereof. Besides the threshold voltages, the configuration module may be used to store other configuration data (e.g., the pre-determined time windows for the measured time spans) for the gate monitoring circuit 300. The configuration date may be programmed by the controller 102 through, e.g., the SPI interface. As illustrated in FIG. 3A, the gate monitoring circuit 300 further includes one or more gate monitoring self-test (BIST) circuits 313, where each of the BIST circuits 313 includes a timer and additional circuits (e.g., a self-test circuit), details of which are illustrated in FIG. 4.

FIG. 4 illustrates an embodiment circuit diagram of the BIST circuit 313. Not all features of the BIST circuit 313 are illustrated in FIG. 4. Note that the BIST circuit 313 only illustrates one timer and a corresponding self-test circuit. Therefore, in order to have two timers (e.g., the first timer 205 and the second timer 207 in FIG. 2B), each gate monitoring circuit 300 may include two instances of the BIST circuit 313. The timers of the gate monitoring circuit may be collectively referred to as a timer circuit. Each of the timers in the timer circuit may be used to measure (e.g., directly or indirectly) a time span, and the gate monitoring circuit 300 may perform a status check each time the power switches 105 are switched on or off, by checking whether the measured time spans (e.g., $T_{prop1}$ and $T_{rise}$, or $T_{prop2}$ and $T_{fall}$) are within their respective pre-determined time windows. The status check may also include checking whether the control voltage at the output of the driver circuit 107 is above a voltage threshold (e.g., Vc). If any of the measured time span is outside the respective pre-determined time window, or if the control voltage is above the voltage threshold, the gate monitoring circuit 300 may generate an error signal to indicate the fault condition. Note that the driver circuit 107 and the comparator module 331A (or 331B) illustrated in FIG. 4 are not formed in the BIST circuit 313. Instead, they correspond to the driver circuit 107 of FIG. 1B and the comparator module 331A (or 331B) of FIG. 3A, respectively. The driver circuit 107 and the comparator module 331A (or 331B) are illustrated in FIG. 4 solely for the purpose of illustrating the electrical connections, and thus, are not part of the BIST circuit 313.

Referring to FIG. 4, the BIST circuit 313 has an input terminal 419. The input to the input terminal 419 is the gate control signal $V_{GCNTL}$ that switches the driver circuit 107 on and off. In some embodiments, the rising edge and the falling edge of the gate control signal $V_{GCNTL}$, which correspond to the time instant for switching the driver circuit 107 on and off, respectively, are used to start the timer (see discussion hereinafter regarding shift register 412) of the BIST circuit 313. The timer may be initialized (e.g., cleared to zero), e.g., by the rising edge and/or the falling edge of the gate control signal $V_{GCNTL}$ to get ready for counting the time, in some embodiments. The timer is stopped by the (e.g., rise edge of) output signal 325 (or 324) of the corresponding comparator module 331A (or 331B). For the example of FIG. 2A, if the timer of the BIST circuit 313 is stopped by the signal 325, then the timer serves to measure the time span time1 (see FIG. 2A) during the turn-on process, and serves to measure the time span time2 (see FIG. 2A) during the turn-off process.

The timer of the BIST circuit 313 is a shift register 412 implemented as a delay line that includes a plurality of serially concatenated D flip-flops 411. The D flip-flops 411 may be clocked by a high speed (e.g., 160 MHz) clock signal 423 supplied to an input terminal 421 to provide enough accuracy in the measured time span. The number of D flip-flops 411 illustrated in FIG. 4 is for illustration purpose and not limiting. In some embodiments, the number of D flip-flops 411 is determined by the maximum time span to be measured. For example, if the time delay of each D flip-flop 411 is T, the number of D flip-flops 411 is N, then N×T should be equal to or larger than a maximum time span to be measured by the timer of the BIST circuit 313. The maximum time span may be an upper limit of the pre-determined time window for the measured time span (e.g., $T_{prop1}$, $T_{prop2}$, $T_{rise}$, or $T_{fall}$).

FIG. 4 illustrates an auxiliary circuit 417 coupled to the input terminal 419 and the D flip-flops 411 (and 413). In some embodiments, the auxiliary circuit 417 includes a circuit that converts the rising edge and/or the falling edge of the gate control signal $V_{GCNTL}$ into a pulse signal. The pulse signal is used as the input to the shift register 412, as illustrated in FIG. 4. In some embodiments, as the pulse signal is shifted down (e.g., to the right) the shift register 412, the values of all the D flip-flops 411 (also referred to as the value of the shift register 412), listed from the left-most D flip-flop 411 to the right-most D flip-flop 411, has a format similar to "0 . . . 010 . . . 0," where the position of the value "1" is shifted from the left to the right with each clock cycle, until the clock signal to the shift register 412 is stopped (e.g., by the signal 325 or 324) or until the value "1" shifts out of the shift register 412.

As illustrated in FIG. 4, when the signal 325 (or 334) transitions from "0" to "1," the rising edge of the signal, after being inverted by an inverter 408, is used to load a value "1" into a D flip-flop 407. The output of the D flip-flop 407, which is now "1," is sent to an inverted input terminal of an AND gate 409, thereby gating the clock signal of the shift register 412. In other words, the clock signal of the shift register 412 is forced to low and is no longer toggling. As a result, the shift register 412 is deactivated, the value "1" is no longer shifting down (e.g., to the right) the shift register 412, and the timer is stopped.

Once the timer is stopped, the gate monitoring circuit 300 may determine the measured time span by checking the location of the value "1" in the shift register 412. For example, the time span measured by the timer may be calculated by multiplying the delay T of the D flip-flop 411 with the distance (e.g., number of D flip-flops) between the D flip-flop 411 having the value "1" and the left-most D flip-flop 411. For the example of FIG. 2A, if the timer of the BIST circuit 313 serves to measure the time span time1, the measured time span corresponds to the propagation time $T_{prop1}$ (during turn-on process) or $T_{prop2}$ (during turn-off process). If the timer of the BIST circuit 313 serves to measure the time span time2 of FIG. 2A, the measured time span is subtracted by a second time span measured by a second timer (serving to measure the time span time1 of FIG. 2A) of a second BIST circuit 313 (see FIG. 3A). The subtraction may be performed using a subtraction circuit 314, and the difference between the two measured time spans corresponds to the rise time $T_{rise}$ (during turn-on process) or the fall time $T_{fall}$ (during turn-off process).

The BIST circuit 313 further includes a second shift register 414 implemented as a delay line formed by a plurality of serially concatenated D flip-flops 413. Instead of measuring an unknown time span, the shift register 414 is used to indicate that a pre-determined duration of time has elapsed. The output of the right-most D flip-flop in the shift register 414 is connected to a first input terminal of an AND gate 415, and the output of the left-most D flip-flop in the shift register 412 is connected to a second input terminal of the AND gate 415. The shift register 412 and the shift register 414 are used to detect fault conditions by performing a timing test of the gate monitoring circuit 300. Details of the timing test are discussed hereinafter.

The number of D flip-flops 413 illustrated in FIG. 4 is for illustration purpose and not limiting. The shift register 414 has the same input as the shift register 412. As illustrated in FIG. 4, the shift register 414 is driven by an inverted version of the clock signal 423. The number of D flip-flops in the shift register 414 is chosen such that the total delay of the shift register 414 is equal to a pre-determined duration, which pre-determined duration may be programmable (e.g., programmable by the controller 102).

In some embodiments, the pre-determined duration of the shift register 414 is substantially equal to the upper limit of the pre-determined time window for the time span being measured by the timer (e.g., shift register 412) of the BIST circuit 313, which time span may be, e.g., $T_{prop1}$, $T_{prop1}$+$T_{rise}$, $T_{prop2}$, or $T_{prop2}$+$T_{fall}$ for the example of FIG. 2A. For example, the total delay of the shift register 414 may be set to $T_{prop1}$ if the timer is measuring the propagation time $T_{prop1}$, and may be set to $T_{prop1}$+$T_{rise}$ if the timer is measuring the duration between time T1 and time T3. Therefore, when a value of "1" appears at the output of the right-most D flip-flop of the shift register 414, it indicates that the pre-determined duration has elapsed, and in response, the gate monitoring circuit 300 performs a timing test by checking the state of the power switches 105, and/or by checking the values of the shift register 412.

Once the shift register 414 indicates that the pre-determined duration has elapsed, the gate monitoring circuit 300 checks whether the timer (e.g., the shift register 412) of the BIST circuit 313 has been stopped. This may be achieved by checking the status signals (e.g., 325, 323, 324, or 321). For example, for the turn-on process of FIG. 2A, the signal 325 should be "1" after a duration of $T_{prop1}$ has elapsed; and the signal 324 should be "1" after a duration of $T_{prop1}$+$T_{rise}$ has elapsed. If the trigger signal (e.g., 325 or 324) has not been asserted after the pre-determined duration has elapsed, the power switch 105 is in a wrong state, and switching time of the power switch 105 is larger than the pre-determined time window. Therefore, the gate monitoring circuit 300 reports a fault condition, and a safe state sequence may be initiated.

If the trigger signal (e.g., 325 or 324) has been asserted after the pre-determined duration has elapsed, the gate monitoring circuit 300 determines the measured time span as discussed above. In some embodiments, the gate monitoring circuit 300 compares the measured time span (e.g., $T_{prop1}$, $T_{prop2}$, $T_{rise}$, or $T_{fall}$) with a respective pre-determined time window. If the measured time span is outside the respective pre-determined time window, a fault condition is reported, and/or the safe state sequence may be started by, e.g., the controller 102 to bring the power control circuit 100 into a safe state. In some embodiments, the gate monitoring circuit 300 measures (e.g., by checking the signal 321, 323, 324, or 325) the state of the power switch 105 after the pre-determined duration has elapsed, and compares the measured state of the power switch 105 with an expected state of the power switch 105. The expected state of the power switch 105 may be supplied by, e.g., the controller 102, and may be stored in the configuration module 311. A fault condition is detected when the measured state of the power switch 105 does not match with the expected state of the power switch 105.

Still referring to FIG. 4, the output of the AND gate 415 may indicate a fault condition where the output of the comparator module 331A/331B is stuck in an asserted state (e.g., outputting a value of "1" at all times), in which case the clock signal to the shift register 412 is disabled, and the value of "1" is not shifted down the shift register 412. As a result, only the left-most D flip-flop 411 has a value of "1" (e.g., due to the value "1" being loaded into the left-most D flip-flop 411 when the gate control signal $V_{GCNTL}$ was asserted), and the rest of the D flip-flops 411 has a value of "0." When the value "1" appears at the output of the right-most D flip-flop of the shift register 414, the output of the AND gate 415 turns into "1," which may be used to detect the above fault condition (e.g., the output of the comparator module 331A/331B stuck in an asserted state). FIG. 4 further illustrates a test pattern generator 405, which may be configured to generate known test voltage patterns (e.g., a ramp signal). The output of the test pattern generator 405 may be used for self-testing or calibration of the gate monitoring circuit 300. Therefore, the test pattern generator 405, the shift register 414, and the AND gate 415 act as a self-diagnosis circuit of the gate monitoring circuit 300.

Embodiments may achieve various advantages. For example, the gate monitoring circuit 300 checks the state and/or the switching time (e.g., propagation time, rise time, fall time) of the power switches 105 each time the power switches 105 are switched on or off. This allows for real-time monitoring and early detection of fault conditions, such that safety protocols (e.g., safe state sequence) may be initiated to alleviate or prevent damage caused by the fault conditions. The gate monitoring circuit 300 is programmable, such that the voltage thresholds Va/Vb/Vc and the pre-determined time windows may be reconfigured for different types (e.g., MOSFETs, or IGBTs) of power switches 105. This allows great flexibility for using the pre-driver IC 103 with different types of power switches 105. The controller 102, through the SPI interface, may initiate different safe state sequences for different types of applications (e.g., power steering, or 12-phase starter motor). By measuring two different time spans, e.g., $T_{prop1}$ and $T_{rise}$ during turn-on process, or $T_{prop2}$ and $T_{fall}$ during turn-off process, the presently disclosed methods provide more detailed monitoring and diagnostic information that existing methods. For example, checking that the measured propagation time (e.g., $T_{prop1}$ or $T_{prop2}$) is within the pre-determined time window may be used to confirm that static aspects of the power control circuit 100 are in accordance with specification, e.g., the driver circuits 107 is present and functional, and that the power switches 105 are connected to the driver circuits 107 properly. Similarly, checking that the measured rise time $T_{rise}$ and fall time $T_{fall}$ are within the respective pre-determined time window may be used to confirm that dynamic aspects of the power control circuit 100 are in accordance with specification, e.g., the power switch 105 are switching properly at target speed, and the driving strength of the driver circuits 107 are sufficient to drive the power switches 105 at target speed.

FIG. 5 illustrates a flow chart of a method of monitoring a gate of a transistor, in accordance with some embodiments. It should be understood that the embodiment method shown in FIG. 5 is merely an example of many possible embodiment methods. One of ordinary skill in the art would recognize many variations, alternatives, and modifications. For example, various steps as illustrated in FIG. 5 may be added, removed, replaced, rearranged and repeated.

Referring to FIG. 5, at step 2010, a gate voltage of the transistor is monitored. For example, the gate voltage $V_{GS}$ of the transistor may be monitored by the gate monitoring circuit 300, e.g., by comparing the gate voltage $V_{GS}$ with the threshold voltages Va, Vb, and Vc. At step 2020, a first time difference is measured between when a gate control signal is asserted and when the gate voltage of the transistor crosses a first voltage threshold based on the monitoring. The first time difference may correspond to the propagation time $T_{prop1}$ of FIG. 2A, and the first voltage threshold may be Va of FIG. 2A. At step 2030, a second time difference is measured between when the gate voltage of the transistor crosses the first voltage threshold and when the gate voltage of the transistor crosses a second voltage threshold based on the monitoring. The second time difference may correspond to the rise time $T_{rise}$ of FIG. 2A, and the second voltage threshold may be Vb of FIG. 2A. The embodiment circuit of FIG. 2C may be used to measure the first time difference and the second time difference. At step 2040, whether the first time difference falls within a first time window and whether the second time difference falls within a second time window are determined.

Example embodiments of the present invention are summarized here. Other embodiments can also be understood from the entirety of the specification and the claims filed herein.

Example 1

In an embodiment, a method of monitoring a gate of a transistor includes monitoring a gate voltage of the transistor; measuring a first time difference between when a gate control signal is asserted and when the gate voltage of the transistor crosses a first voltage threshold based on the monitoring; measuring a second time difference between when the gate voltage of the transistor crosses the first voltage threshold and when the gate voltage of the transistor crosses a second voltage threshold based on the monitoring; and determining whether the first time difference falls within a first time window, and whether the second time difference falls within a second time window.

Example 2

The method of example 1, further comprising asserting an error signal when the first time difference falls outside of the first time window or when the second time difference falls outside of the second time window.

Example 3

The method of example 2, further comprising disabling a driver coupled to the gate of the transistor when the error signal is asserted.

Example 4

The method of example 1, further comprising driving the gate of the transistor based on the gate control signal using a gate driver circuit.

Example 5

The method of example 4, where the first time difference falling within the first time window and the second time difference falling within the second time window indicate that the gate driver circuit and the transistor are functioning without a fault.

Example 6

The method of example 1, further comprising: measuring a third time difference between when the gate control signal is de-asserted and when the gate voltage of the transistor crosses the second voltage threshold based on the monitoring; measuring a fourth time difference between when the gate voltage of the transistor crosses the second voltage threshold and when the gate voltage of the transistor crosses the first voltage threshold based on the monitoring; and determining whether the third time difference falls within a third time window, and whether the fourth time difference falls within a fourth time window.

Example 7

The method of example 1, where monitoring the gate voltage of the transistor comprises: comparing the gate voltage to the first voltage threshold using a first comparator; and comparing the gate voltage to the second voltage threshold using a second comparator.

Example 8

The method of example 7, wherein: measuring the first time difference comprises activating a first shift register when the gate control signal is asserted, and deactivating the first shift register when an output of the first comparator is asserted; determining whether the first time difference falls within the first time window comprises monitoring a state of the first shift register; measuring the second time difference comprises activating a second shift register when the output of the first comparator is asserted, and deactivating the first shift register when an output of the second comparator is asserted; and determining whether the second time difference falls within the first time window comprises monitoring a state of the second shift register.

Example 9

The method of example 7, wherein: measuring the first time difference comprises starting a first timer when the gate control signal is asserted, and stopping the first timer when an output of the first comparator is asserted; and measuring the second time difference comprises starting a second timer when the gate control signal is asserted, stopping the second timer when an output of the second comparator is asserted, and subtracting the output of the first timer from an output of the second timer.

Example 10

The method of example 1, where the first voltage threshold is 1.7 V and the second voltage threshold is 6.5V.

Example 11

In an embodiment, a circuit includes a gate monitoring circuit having a first input configured to receive a gate voltage of a transistor, and a second input configured to receive a gate control signal. The gate monitoring circuit includes a first comparator configured to compare the gate voltage of the transistor to a first voltage threshold; a second comparator configured to compare the gate voltage of the transistor to a second voltage threshold; and a timer circuit configured to: measure a first time difference between when a gate control signal is asserted and when an output of the first comparator is asserted, measure a second time difference between when the output of the first comparator is asserted and an output of the second comparator is asserted, determine whether the first time difference falls within a first time window, and whether the second time difference falls within a second time window, and generate an error signal when the first time difference falls outside of the first time window or when the second time difference falls outside of the second time window.

Example 12

The circuit of example 11, further comprising a gate driver circuit having an output coupled to the first input of the gate monitoring circuit, and an input coupled to the second input of the gate monitoring circuit.

Example 13

The circuit of example 12, wherein the gate driver circuit is configured to be disabled when the error signal is asserted.

Example 14

The circuit of example 12, further comprising a transistor having a gate coupled to the output of the gate driver circuit.

Example 15

The circuit of example 11, wherein the timer circuit comprises: a first shift register configured to be activated when the gate control signal is asserted and deactivated when the output of the first comparator is asserted, wherein whether the first time difference falls within a first time window is determined based on a state of the first shift register; and a second shift register configured to be activated when the output of the first comparator is asserted and deactivated when an output of the second comparator is asserted, wherein whether the second time difference falls within a first time window is determined based on a state of the second shift register.

Example 16

The circuit of example 11, wherein the timer circuit includes a first timer configured to be activated when the gate control signal is asserted and deactivated when the output of the first comparator is asserted, wherein an output of the first timer is proportional to the first time difference; a second timer configured to be activated when the gate control signal is asserted and deactivated when the output of the second comparator is asserted; and a subtraction circuit having inputs coupled to the output of the first timer and the output of the second timer, wherein an output of the second timer is proportional to the second time difference.

Example 17

In an embodiment, a power control integrated circuit includes a driver circuit having an output terminal configured to be electrically coupled to a control terminal of a power switch; and a gate monitoring circuit electrically coupled to the output terminal of the driver circuit. The gate monitoring circuit includes a first timer configured to measure a first time span, where the first time span is a duration between a first time instant the driver circuit is switched on or off to drive the power switch and a second time instant a control voltage at the output terminal of the driver circuit reaches a first pre-determined threshold; a second timer configured to measure a second time span, where the second time span is a duration between the second time instant and a third time instant the control voltage reaches a second pre-determined threshold; and a comparator configured to detect that the control voltage is above a third pre-determined threshold.

Example 18

The power control integrated circuit of example 17, where the second pre-determined threshold is larger than the first pre-determined threshold, the third pre-determined threshold is larger than the second pre-determined threshold, and where the driver circuit starts switching on the power switch at the first time instant.

Example 19

The power control integrated circuit of example 17, where the first pre-determined threshold is larger than the second pre-determined threshold, the third pre-determined threshold is larger than the first pre-determined threshold, and where the driver circuit starts switching off the power switch at the first time instant.

Example 20

The power control integrated circuit of example 17, where the gate monitoring circuit is configured to perform a status check, where performing the status check includes generating a first error signal in response to detecting that the first time span is outside a first pre-determined time window; generating a second error signal in response to detecting that the second time span is outside a second pre-determined time window; and generating a third error signal in response to detecting that the control voltage is above the third pre-determined threshold.

Example 21

The power control integrated circuit of example 20, where the status check is performed each time the power switch is switched on or off.

Example 22

The power control integrated circuit of example 17, where the gate monitoring circuit further includes a self-diagnosis circuit, where the self-diagnosis circuit is configured to detect a malfunction of the gate monitoring circuit in real-time as the power switch is being switched on or off.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of monitoring a gate of a transistor, the method comprising:
    monitoring a gate voltage of the transistor;
    measuring a first time difference between when a gate control signal is asserted and when the gate voltage of the transistor crosses a first voltage threshold based on the monitoring;
    measuring a second time difference between when the gate voltage of the transistor crosses the first voltage threshold and when the gate voltage of the transistor crosses a second voltage threshold based on the monitoring; and
    determining whether the first time difference falls within a first time window, and whether the second time difference falls within a second time window.

2. The method of claim 1, further comprising asserting an error signal when the first time difference falls outside of the first time window or when the second time difference falls outside of the second time window.

3. The method of claim 2, further comprising disabling a driver coupled to the gate of the transistor when the error signal is asserted.

4. The method of claim 1, further comprising driving the gate of the transistor based on the gate control signal using a gate driver circuit.

5. The method of claim 4, wherein the first time difference falling within the first time window and the second time difference falling within the second time window indicate that the gate driver circuit and the transistor are functioning without a fault.

6. The method of claim 1, further comprising:
    measuring a third time difference between when the gate control signal is de-asserted and when the gate voltage of the transistor crosses the second voltage threshold based on the monitoring;
    measuring a fourth time difference between when the gate voltage of the transistor crosses the second voltage threshold and when the gate voltage of the transistor crosses the first voltage threshold based on the monitoring; and
    determining whether the third time difference falls within a third time window, and whether the fourth time difference falls within a fourth time window.

7. The method of claim 1, wherein monitoring the gate voltage of the transistor comprises:
    comparing the gate voltage to the first voltage threshold using a first comparator; and
    comparing the gate voltage to the second voltage threshold using a second comparator.

8. The method of claim 7, wherein:
    measuring the first time difference comprises activating a first shift register when the gate control signal is asserted, and deactivating the first shift register when an output of the first comparator is asserted;

determining whether the first time difference falls within the first time window comprises monitoring a state of the first shift register;

measuring the second time difference comprises activating a second shift register when the output of the first comparator is asserted, and deactivating the first shift register when an output of the second comparator is asserted; and determining whether the second time difference falls within the first time window comprises monitoring a state of the second shift register.

9. The method of claim 7, wherein:

measuring the first time difference comprises starting a first timer when the gate control signal is asserted, and stopping the first timer when an output of the first comparator is asserted; and measuring the second time difference comprises starting a second timer when the gate control signal is asserted, stopping the second timer when an output of the second comparator is asserted, and subtracting the output of the first timer from an output of the second timer.

10. The method of claim 1, wherein the first voltage threshold is 1.7 V and the second voltage threshold is 6.5V.

11. A circuit comprising:

a gate monitoring circuit having a first input configured to receive a gate voltage of a transistor, and a second input configured to receive a gate control signal, the gate monitoring circuit comprising:
    a first comparator configured to compare the gate voltage of the transistor to a first voltage threshold;
    a second comparator configured to compare the gate voltage of the transistor to a second voltage threshold; and
    a timer circuit configured to
        measure a first time difference between when a gate control signal is asserted and when an output of the first comparator is asserted,
        measure a second time difference between when the output of the first comparator is asserted and an output of the second comparator is asserted,
        determine whether the first time difference falls within a first time window, and whether the second time difference falls within a second time window, and
        generate an error signal when the first time difference falls outside of the first time window or when the second time difference falls outside of the second time window.

12. The circuit of claim 11, further comprising a gate driver circuit having an output coupled to the first input of the gate monitoring circuit, and an input coupled to the second input of the gate monitoring circuit.

13. The circuit of claim 12, wherein the gate driver circuit is configured to be disabled when the error signal is asserted.

14. The circuit of claim 12, further comprising a transistor having a gate coupled to the output of the gate driver circuit.

15. The circuit of claim 11, wherein the timer circuit comprises:

a first shift register configured to be activated when the gate control signal is asserted and deactivated when the output of the first comparator is asserted, wherein whether the first time difference falls within a first time window is determined based on a state of the first shift register; and a second shift register configured to be activated when the output of the first comparator is asserted and deactivated when an output of the second comparator is asserted, wherein whether the second time difference falls within a first time window is determined based on a state of the second shift register.

16. The circuit of claim 11, wherein the timer circuit comprises:

a first timer configured to be activated when the gate control signal is asserted and deactivated when the output of the first comparator is asserted, wherein an output of the first timer is proportional to the first time difference;

a second timer configured to be activated when the gate control signal is asserted and deactivated when the output of the second comparator is asserted; and a subtraction circuit having inputs coupled to the output of the first timer and the output of the second timer, wherein an output of the second timer is proportional to the second time difference.

17. A power control integrated circuit (IC) comprising:

a driver circuit having an output terminal configured to be electrically coupled to a control terminal of a power switch; and a gate monitoring circuit electrically coupled to the output terminal of the driver circuit, the gate monitoring circuit comprising:
    a first timer configured to measure a first time span, wherein the first time span is a duration between a first time instant the driver circuit is switched on or off to drive the power switch and a second time instant a control voltage at the output terminal of the driver circuit reaches a first pre-determined threshold;
    a second timer configured to measure a second time span, wherein the second time span is a duration between the second time instant and a third time instant the control voltage reaches a second pre-determined threshold; and
    a comparator configured to detect that the control voltage is above a third pre-determined threshold.

18. The power control integrated circuit of claim 17, wherein the second pre-determined threshold is larger than the first pre-determined threshold, the third pre-determined threshold is larger than the second pre-determined threshold, and wherein the driver circuit starts switching on the power switch at the first time instant.

19. The power control integrated circuit of claim 17, wherein the first pre-determined threshold is larger than the second pre-determined threshold, the third pre-determined threshold is larger than the first pre-determined threshold, and wherein the driver circuit starts switching off the power switch at the first time instant.

20. The power control integrated circuit of claim 17, wherein the gate monitoring circuit is configured to perform a status check, wherein performing the status check comprises:

generating a first error signal in response to detecting that the first time span is outside a first pre-determined time window;

generating a second error signal in response to detecting that the second time span is outside a second pre-determined time window; and generating a third error signal in response to detecting that the control voltage is above the third pre-determined threshold.

21. The power control integrated circuit of claim 20, wherein the status check is performed each time the power switch is switched on or off.

22. The power control integrated circuit of claim 17, wherein the gate monitoring circuit further comprises a self-diagnosis circuit, wherein the self-diagnosis circuit is configured to detect a malfunction of the gate monitoring circuit in real-time as the power switch is being switched on or off.

\* \* \* \* \*